(12) United States Patent
Sanada et al.

(10) Patent No.: US 6,440,218 B1
(45) Date of Patent: Aug. 27, 2002

(54) COATING SOLUTION APPLYING METHOD AND APPARATUS

(75) Inventors: Masakazu Sanada; Kayoko Nakano; Shigehiro Goto; Minobu Matsunaga, all of Kyoto (JP)

(73) Assignee: Dainippon Screen Mfg. Co., Ltd., Kyoto (JP)

( * ) Notice: Subject to any disclaimer, the term of this patent is extended or adjusted under 35 U.S.C. 154(b) by 0 days.

(21) Appl. No.: 09/450,946

(22) Filed: Nov. 29, 1999

(30) Foreign Application Priority Data

Nov. 30, 1998 (JP) .......................... 10-338783

(51) Int. Cl.[7] .............................. B05C 11/00
(52) U.S. Cl. .................. 118/697; 118/699; 118/704; 118/52; 118/320; 118/321
(58) Field of Search ................... 427/164, 168, 427/240, 385.5, 425; 118/52, 320, 696, 697, 699, 704, 321

(56) References Cited

U.S. PATENT DOCUMENTS

| 5,238,878 | A | * | 8/1993 | Shinohara | 437/231 |
|---|---|---|---|---|---|
| 5,677,001 | A | * | 10/1997 | Wang et al. | 427/240 |
| 5,780,105 | A | * | 7/1998 | Wang | 427/240 |
| 5,976,620 | A | * | 11/1999 | Sanada et al. | 427/240 |
| 5,989,632 | A | * | 11/1999 | Sanada et al. | 427/240 |
| 6,117,486 | A | * | 9/2000 | Yoshihara | 427/240 |
| 6,207,231 | B1 | * | 3/2001 | Tateyama | 427/240 |
| 6,225,240 | B1 | * | 5/2001 | You et al. | 438/782 |

* cited by examiner

*Primary Examiner*—Shrive P. Beck
*Assistant Examiner*—Kirsten A. Crockford
(74) *Attorney, Agent, or Firm*—Arent Fox Kintner Plotkin & Kahn

(57) ABSTRACT

An apparatus for applying a coating solution to a surface of a substrate to form a coating film of desired thickness thereon. The apparatus includes a rotary supporting device for supporting and spinning the substrate in horizontal posture, a solvent spraying device for spraying a solvent to the substrate, a coating solution supplying device for supplying the coating solution to the substrate, a storage device for storing a processing program stipulating varied points and periods of time, a timer acting as a reference for each point or period of time stored in the storage, and a controller operable to perform controls based on the points and periods of time and with reference to the timer.

4 Claims, 11 Drawing Sheets

COATING SOLUTION APPLYING METHOD AND APPARATUS

BACKGROUND OF THE INVENTION (1) Field of the Invention

The present invention relates to methods and apparatus for applying a coating solution such as SOG (Spin On Glass, also called a silica coating material), photoresist or polyimide resin to substrates such as semiconductor wafers, glass substrates for photomasks, glass substrates for liquid crystal displays or glass substrates for optical disks (hereinafter referred to simply as substrates or as wafers). More particularly, the invention relates to a technique of supplying a coating solution to the surface of each substrate to form a coating film in a desired thickness thereon.

(2) Description of the Related Art

In a conventional coating solution applying method of the type noted above, a coating solution supplied to a substrate forms a substantially circular drop (hereinafter referred to as a core) on the substrate. The drop increases in diameter for a time. Subsequently, the coating solution begins to flow in a plurality of rivulets (hereinafter referred to as fingers) extending radially from the core toward the edge of the substrate. After the fingers reach the edge of the substrate, a large quantity of the coating solution supplied to the core flows through the fingers to scatter to the ambient. Thus, a long time and a large quantity of the coating solution are consumed before the entire substrate surface is covered by the coating solution. In order to cover the entire substrate surface, it is necessary to take into account the quantity of coating solution scattering to the ambient, and to supply the coating solution in a correspondingly increased quantity.

To overcome the above disadvantage, a method has been proposed in which, by way of pretreatment, a solvent is dripped onto a substrate to spin-coat the entire surface thereof first. This step is taken to facilitate spreading of the coating solution over the substrate surface. Then, the coating solution is dripped onto the substrate to spin-coat the surface thereof.

The conventional method noted above has the following drawbacks.

The solvent used in the pretreatment tends to stagnate in recessed parts of a circuit pattern formed on the substrate. The solvent trapped under a coating film formed could turn into bubbles when the film is baked. This results in irregularities of the coating film obtained ultimately.

In addition, while the pretreatment with the solvent facilitates spreading of the coating solution, thereby reducing consumption of the latter, the solvent per se has to be consumed in a large quantity.

SUMMARY OF THE INVENTION

The present invention has been made having regard to the state of the art noted above, and its object is to provide a coating solution applying method in which a solvent is sprayed in advance of supplying a coating solution, to avoid irregularities due to the solvent, and to drastically reduce the quantity of coating solution needed to form a coating film while suppressing solvent consumption.

The above object is fulfilled, according to this invention, by a method of applying a coating solution to a surface of a substrate to form a coating film of desired thickness thereon, comprising the steps of:

(a) spraying a solvent over the surface of the substrate maintained still or spun at a first rotational frequency;

(b) supplying the coating solution to a region centrally of the surface of the substrate maintained still or spun at a second rotational frequency;

(c) accelerating the substrate to a third rotational frequency before the coating solution supplied at step (b) above spreads and entirely covers the surface of the substrate; and (d) spinning the substrate at a fourth rotational frequency for a predetermined period of time to adjust thickness of a coating film covering the surface of the substrate.

First, before supplying the coating solution to the surface of the substrate, the solvent is sprayed over the surface of the substrate maintained still or spun at the first rotational frequency (step (a)). The solvent sprayed before application of the coating solution produces the effect of reducing the angle of contact between the coating solution and the surface of the substrate. When the coating solution is supplied to the substrate subsequently, the coating solution may spread extremely smoothly over the substrate surface. Since the solvent is not supplied in droplets but is sprayed in mist, the solvent may cover a large area on the substrate within a short time. Even if recesses such as of a circuit pattern are formed on the surface of the substrate, the solvent hardly stagnates in such portions.

After the solvent is sprayed, the coating solution is supplied to a region centrally of the surface of the substrate maintained still or spun at the second rotational frequency (step (b)). In the initial spreading stage of the coating solution, numerous fingers develop from a circular core of the coating solution, and begin to extend radially toward the edge of the substrate. When the numerous fingers reach the edge of the substrate, the coating solution would flow through the fingers to scatter to the ambient. Thus, a large quantity of coating solution would be wasted. To avoid such a situation, the substrate is accelerated to the third rotational frequency before the coating solution supplied spreads and entirely covers the surface of the substrate (step (c)).

Under this rotational frequency control, the coating solution exhibits a behavior as shown in FIG. 4.

Where, as in the prior art, the second rotational frequency is maintained, the core Ra and fingers Rb shown as a hatched region in FIG. 4 enlarge and extend toward the edge of substrate W, as shown in a two-dot chain line, under the centrifugal force. However, as the spin of the substrate is accelerated to the third rotational frequency, the fingers Rb are subjected to a force of inertia, i.e. a force acting in the direction opposite to the direction of spin. The resultant of centrifugal force and inertia bends the fingers Rb circumferentially,. thereby enlarging widths thereof. The leading ends of fingers Rb extend under the centrifugal force toward the edge of substrate W (as shown in a dotted line in FIG. 4). The diameter of core Ra also increases. Moreover, since the solvent has been sprayed before the coating solution is applied, the fingers Rb are readily bent to great degrees circumferentially. Though not shown in the schematic view, with the solvent applied beforehand, the fingers Rb are formed more thinly and in a greater number than in the prior art. The diameter of core Ra also increases more quickly than in the prior art.

Thus, the fingers Rb not only extend toward the edge of substrate W, but greatly increase in width in a circumferential direction. The regions between the fingers Rb diminish rapidly, to shorten the time taken for the coating solution to cover the entire surface of the substrate. The shortened coating time means that only a short time is taken from start of the supply of the coating solution to finish of the supply after the coating solution covers the entire surface of substrate W. In other words, a reduced time is taken from arrival of fingers Rb at the edge of substrate W to finish of the coating solution supply. Thus, a correspondingly reduced quantity of the coating solution scatters to the ambient through the fingers Rb. Thereafter the fourth rotational frequency is maintained for a predetermined period (step (d)) to dispel a superfluous part of the coating solution. In this way, a reduced quantity of coating solution is required to form a coating film of desired thickness.

By accelerating the substrate before the coating solution covers the entire surface thereof, a force of inertia may be applied to the rivulets of coating solution extending radially from the circular drop of coating solution, thereby rapidly diminishing the regions between the radially extending rivulets of coating solution. In addition, since the solvent has been sprayed before the coating solution is applied, thin rivulets of coating solution may be formed in an increased number. The solvent also promotes the concentric increase in diameter of the coating solution, and facilitates circumferential bending of the rivulets under the force of inertia.

Thus, a reduce time is taken for the coating solution to cover the entire surface of the substrate. As a result, a reduced quantity of coating solution scatters to the ambient through the radially extending rivulets. A reduced quantity of coating solution is required to form a coating film of desire thickness. Since the solvent is sprayed before the coating solution is supplied, the solvent can cover a wide range in a short time. Even if recesses of a circuit pattern have been formed on the surface of the substrate, the solvent hardly stagnates in such portions. The coating film formed is free from irregularities due to the solvent. While checking consumption of the solvent as above, the expensive coating solution may be used in a reduced quantity. With the reduced consumption of the solvent and coating solution, semiconductor devices and the like may be manufactured at low cost and with improved throughput.

In a known coating solution applying method, the substrate is spun at high speed when the coating solution is supplied, and thereafter the substrate is decelerated to adjust film thickness, thereby reducing the quantity of coating solution used. In this case, the solvent sprayed would vaporize to diminish the advantage of its use. According to the present invention, the solvent does not vaporize easily, thereby taking full advantage of its use.

Preferably, step (b) of the present invention is executed to start and finish supplying the coating solution while the substrate is spun at the second rotational frequency.

This is what is known as the "dynamic method" in which the coating solution begins to be supplied while the substrate is spun at the second rotational frequency, and the supply is stopped in this state. In this case also, the same effect is produced to shorten the required coating time by accelerating the substrate to the third rotational frequency before the coating solution covers the entire surface of the substrate. Consequently, a reduced quantity of coating solution scatters to the ambient.

It is also preferred that step (b) above is executed to start and finish supplying the coating solution while the substrate is maintained still.

This is what is known as the "static method" in which the coating solution begins to be supplied while the substrate is maintained still, and the supply is stopped in this state. In this case also, the same effect is produced to shorten the required coating time by spinning the substrate and accelerating the spin to the third rotational frequency before the coating solution covers the entire surface of the substrate. Consequently, a reduced quantity of coating solution scatters to the ambient.

Further, step (b) above may be executed to start supplying the coating solution while the substrate is maintained still. and finish supplying the coating solution after the substrate begins to be spun toward the second rotational frequency.

This may be said a combination of the static method and dynamic method in which the coating solution begins to be supplied while the substrate is maintained still, and the supply is stopped after the substrate begins to be spun toward the second rotational frequency (this supplying method being referred to hereinafter as the "stamic method"). In this case also, the same effect is produced to shorten the required coating time by accelerating the substrate to the third rotational frequency before the coating solution covers the entire surface of the substrate. Consequently, a reduced quantity of coating solution scatters to the ambient.

In another aspect of the invention, there is provided a method of applying a coating solution to a surface of a substrate to form a coating film of desired thickness thereon, comprising the steps of:

(a) spraying a solvent over the surface of the substrate maintained still or spun at a first rotational frequency;

(b) supplying the coating solution to a region centrally of the surface of the substrate maintained still or spun at a second rotational frequency;

(c) decelerating the substrate to a third rotational frequency lower than the second rotational frequency before the coating solution supplied at step (b) above spreads and entirely covers the surface of the substrate;

(d) accelerating the substrate to a fourth rotational frequency before the coating solution supplied at step (b) above spreads and entirely covers the surface of the substrate; and (e) spinning the substrate at a fifth rotational frequency for a predetermined period of time to adjust thickness of a coating film covering the surface of the substrate;

wherein step (c) is executed with the coating solution continuing to be supplied at least from start of the deceleration to attainment of the third rotational frequency.

First, before supplying the coating solution to the surface of the substrate, the solvent is sprayed over the surface of the substrate maintained still or spun at the first rotational frequency (step (a)). The solvent sprayed before application of the coating solution produces the effect of reducing the angle of contact between the coating solution and the surface of the substrate. Thus, the coating solution may spread extremely smoothly over the substrate surface. Since the solvent is sprayed in mist, the solvent may cover a large area on the substrate within a short time. Even if a circuit pattern is formed on the surface of the substrate, the solvent hardly stagnates in such pattern portions.

After the solvent is sprayed, the coating solution is supplied to a region centrally of the surface of the substrate maintained still or spun at the second rotational frequency (step (b)). As the coating solution is spread on the substrate spinning at the second rotational frequency, numerous fingers develop from a circular core of the coating solution, and begin to extend radially toward the edge of the substrate as noted hereinbefore. When the numerous fingers reach the edge of the substrate, the coating solution would flow through the fingers to scatter to the ambient. Thus, a large quantity of coating solution would be wasted.

To avoid such a situation, the substrate is temporarily decelerated to the third rotational frequency lower than the second rotational frequency before the coating solution supplied spreads and entirely covers the surface of the substrate (step (c)). This third rotational frequency includes zero rotational frequency, i.e. a state in which the substrate is maintained still. With this rotational frequency control, the coating solution exhibits a behavior as schematically shown in FIGS. 7 through 10. FIGS. 7 and 8 are side views schematically showing the substrate and coating solution. FIGS. 9 and 10 are plan views schematically showing the substrate and coating solution.

When the spin of the substrate begins to be decelerated to the third rotational frequency lower than the second rotational frequency, the enlargement of core Ra and extension of fingers Rb begin to retard. When the third rotational frequency is attained, the growth of core Ra and fingers Rb is stopped substantially and temporarily, compared with the state before commencement of the deceleration. The supply of the photoresist solution is continued at least until attainment of the third rotational frequency. Consequently, the core Ra has an increased quantity of photoresist solution R (FIG. 8) compared with the core Ra before the deceleration (FIG. 7). With the core Ra having the increased quantity of coating solution R, i.e. with the core Ra having increased momentum for growth, and before the coating solution covers the entire surface of substrate W, the substrate is spun again with the rotational frequency increased to the fourth rotational frequency higher than the third rotational frequency (step (d)). Then, the coating solution exhibits a behavior as shown in FIGS. 9 and 10.

If the rotational frequency is maintained as in the prior art, the core Ra and fingers Rb, from the state shown in hatches in FIG. 9, will grow and extend under centrifugal force straight toward the edge of substrate W as shown in a two-dot chain line. Besides, new radial rivulets (hereinafter referred to as new fingers Rb') develop from the core R having increased in volume. These new fingers Rb' begin to extend from between the numerous fingers Rb toward the edge of substrate W.

As the rotational frequency is increased from the third rotational frequency to the fourth rotational frequency, the fingers Rb and new fingers Rb' developing as shown in FIG. 9 are subjected to a force of inertia, i.e. a force acting in the direction opposite to the direction of spin. The resultant of centrifugal force and inertia bends the fingers Rb and new fingers Rb' circumferentially, thereby enlarging widths thereof, as shown a dotted line in FIG. 10. The leading ends of fingers Rb and new fingers Rb' extend under the centrifugal force toward the edge of wafer W. The core Ra also increases in diameter. Moreover, since the solvent has been sprayed before application of the coating solution, the fingers Rb and new fingers Rb' are readily bent to great degrees circumferentially. Though not shown in the schematic views, with the solvent applied beforehand, the fingers Rb and new fingers Rb' are formed more thinly and in a greater number than in the prior art. The diameter of core Ra also increases more quickly than in the prior art.

Consequently, as shown in FIG. 10, the fingers Rb and new fingers Rb' not only extend toward the edge of substrate W, but greatly increase in width in the circumferential direction. Before the fingers Rb reach the edge of substrate W, gaps between the fingers Rb are rapidly narrowed with the aid of new developing fingers Rb'. This drastically reduces the coating time required for the coating solution R to cover the entire surface of substrate W. The shortened coating time means that only a short time is taken from start of the supply of the coating solution to finish of the supply after the coating solution covers the entire surface of substrate W. In other words, a correspondingly reduced quantity of coating solution scatters to the ambient through the fingers Rb (and new fingers Rb'). Thereafter the fifth rotational frequency is maintained for a predetermined period (step (e)) to dispel a superfluous part of the coating solution. In this way, a reduced quantity of coating solution is required to form a coating film of desired thickness.

Thus, before the coating solution supplied to the surface of the substrate covers the entire substrate surface, the substrate is temporarily decelerated to the third rotational frequency while the supply of coating solution is continued. Only the coating solution thereby increases in concentric form to gain increased momentum for growth. Subsequently, the substrate is accelerated whereby new flows of the coating solution develop between the radial flows of the coating solution extending from the coating solution in concentric form, with a force of inertia applied to each flow of the coating solution. The gaps between the radially extending flows are thereby narrowed rapidly. In addition, since the solvent has been sprayed before the coating solution is applied, thin rivulets of coating solution may be formed in an increased number. The solvent also promotes the concentric increase in diameter of the coating solution, and facilitates circumferential bending of the rivulets and new rivulets under the force of inertia.

Thus, a reduce time is taken for the coating solution to cover the entire surface of the substrate. As a result, a drastically reduced quantity of coating solution scatters to the ambient through the radially extending rivulets. A reduced quantity of coating solution is required to form a coating film of desire thickness. The solvent sprayed can cover a wide range in a short time, and hardly stagnates in recessed pattern portions formed on the surface of the substrate. The coating film formed is free from irregularities due to the solvent. While checking consumption of the solvent as above, the expensive coating solution may be used in a reduced quantity. With the reduced consumption of the solvent and coating solution, semiconductor devices and the like may be manufactured at low cost and with improved throughput.

In a known coating solution applying method, the substrate is spun at high speed when the coating solution is supplied, and at low speed when adjusting film thickness, thereby reducing the quantity of coating solution used. In this case, the solvent sprayed would vaporize to diminish the advantage of its use. According to the invention defined in claim 5, the solvent does not vaporize easily, thereby taking full advantage of its use.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Preferred embodiments of the present invention will be described in detail hereinafter with reference to the drawings.

Figure 1:
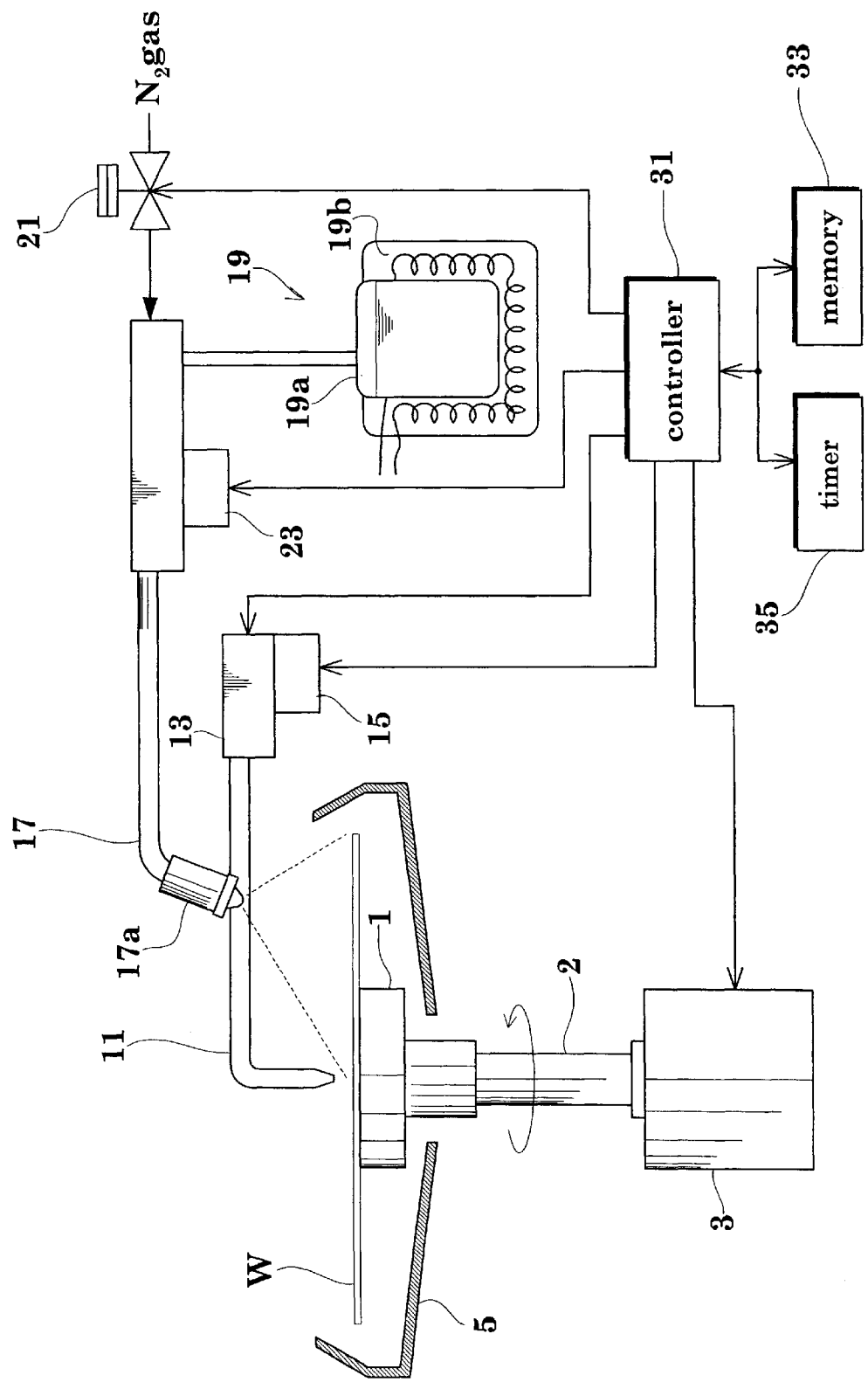
FIG. 1 is a view showing an outline of a substrate spin coating apparatus according to the present invention.

FIG. 1 is a view showing an outline of a substrate spin coating apparatus according to the present invention.

Reference numeral 1 in FIG. 1 denotes a suction type spin chuck for suction-supporting a wafer W in a substantially horizontal posture. This spin chuck 1 is attached to a hollow rotary shaft 2 to be driven by a spin motor 3. Thus, the spin motor 3 drives the spin chuck 1 to spin with the wafer W about a vertical axis.

The spin chuck 1, rotary shaft 2 and spin motor 3 constitute the rotary supporting device of the present invention.

The spin chuck 1 is surrounded by a scatter preventive cup 5 for preventing a coating solution, such as a photoresist solution, and the like from scattering to the ambient. Though not shown in the drawing, the scatter preventive cup 5 and rotary shaft 2 are vertically movable relative to each other to allow an untreated wafer W to be transported into the scatter preventive cup 5 and a treated wafer W to be transported out of the scatter preventive cup 5.

A coating solution supply nozzle 11 is disposed above the scatter preventive cup 5 and substantially over the spin center of wafer W for delivering the photoresist solution to the wafer W. This supply nozzle 11 corresponds to the coating solution supplying device of the present invention. The supply nozzle 11 receives the photoresist solution from a coating solution supplying unit 13. The supply nozzle 11 has a tip end thereof movable by a driving device 15 between a supply position shown in FIG. 1 and a standby position, not shown, sideways retracted from the scatter preventive cup 5.

A solvent spray nozzle 17 is juxtaposed with the coating solution supply nozzle 11 for directing a solvent in mist form to the wafer W. The solvent spray nozzle 17, which corresponds to the solvent spraying device of the present invention, sprays the solvent received from a solvent supplying unit 19. The solvent supplying unit 19 includes a container 19a for storing the solvent, and a heater 19b for heating the container 19a to generate a vapor of the solvent. The solvent spray nozzle 17 receives also $N_2$ gas transmitted under pressure through an electromagnetic switch valve 21. Thus, when the switch valve 21 is opened, the solvent vaporized by the heating action of heater 19b is sprayed, as shown in dotted lines in FIG. 1, from a spray gun 17a attached to a forward end of solvent spray nozzle 17. The solvent is sprayed over a range substantially covering the radius of wafer W. Alternatively, the spray gun 17a may spray the solvent over a range covering the entire surface of wafer W.

The solvent spray nozzle 17 is movable by a driving unit 23 between a supply position shown in FIG. 1 and a standby position not shown. When spraying the solvent to the wafer W maintained still, the spray nozzle 17 is movable to scan a fixed range from the above supply position in order to spray the solvent over the entire surface of wafer W.

The solvent stored in the above solvent supplying unit 19 may, for example, be PGMEA (propylene glycol monomethyl ether acetate) or EL (ethyl lactate) used as the main solvent of the photoresist solution.

The spin motor 3, coating solution supplying unit 13, driving unit 15, solvent supplying unit 19, electromagnetic switch valve 21 and driving unit 23 are controlled by a controller 31.

The controller 31 corresponding to the control device performs controls based on a processing program stored in a memory 33 and corresponding to time charts to be described hereinafter. That is, by referring to the memory 33 and based on a timer 35, the controller 31 controls the respective components at various points and periods of time formulating the processing program.

The various points and periods of time formulating the processing program are stored beforehand in the memory 33 which corresponds to the storage device of the present invention.

Specifically, in the first embodiment (FIG. 2), the memory 33 stores a first (period of) time t1–t2 for maintaining the wafer W still or spinning the wafer W at a first rotational frequency R1, a second (period of) time $t_{PS}$–$t_{PE}$ or $T_{PSU}$ for spraying the solvent to the wafer W, a third (point of) time t3 for maintaining the wafer W still or spinning the wafer W at a second rotational frequency R2, a fourth (period of) time $t_S$–$t_E$ or $T_{SU}$ for supplying the photoresist solution to the wafer W, a fifth (point of) time t4 before the photoresist solution supplied to the wafer W extends over and covers the entire surface of wafer W, a sixth (point of) time t5 for spinning the wafer W with a third rotational frequency R3, and a seventh (period of) time t7–t8 for maintaining the wafer W at a fourth rotational frequency R4 for a predetermined period.

In the second embodiment (FIG. 6) to be described hereinafter, the memory 33 stores a first (period of time t1–t2 for maintaining the wafer W still or spinning the wafer W at a first rotational frequency R1, a second (period of) time $t_{PS}$–$t_{PE}$ or $T_{PSU}$ for spraying the solvent to the wafer W, a third (point of) time t3 for maintaining the wafer W sill or spinning the wafer W at a second rotational frequency R2, a fourth (period of time $t_S$–$t_E$ or $T_{SU}$ for supplying the photoresist solution to the wafer W, a fifth (point of) time t5 before the photoresist solution supplied to the wafer W extends over and covers the entire surface of wafer W, a sixth (point of) time t4 for decelerating the wafer W from the second rotational frequency R2 to a third rotational frequency R3, a seventh (point of) time t5 for accelerating the wafer W to a fourth rotational frequency R4, an eighth (period of) time t8–t9 for maintaining the wafer W at a fifth rotational frequency R5, and a ninth point of) time $t_E$ at which the wafer W reaches the third rotational frequency R3 after starting the deceleration from the second rotational frequency R2.

First Embodiment

"Dynamic Method"

Figure 2:
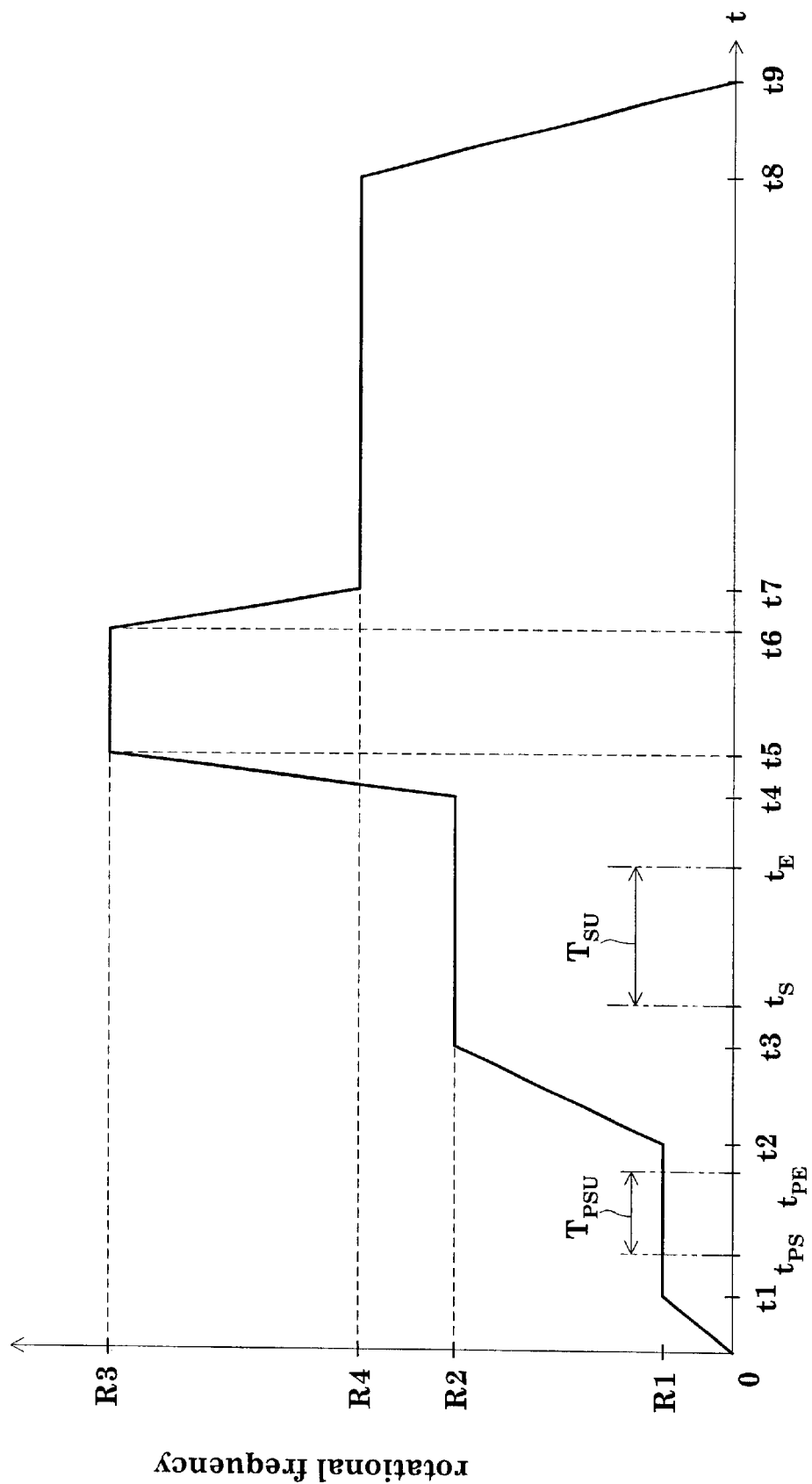
FIG. 2 is a time chart showing a photoresist applying method (dynamic method) in a first embodiment of the invention.

Next, a photoresist solution applying process by the "dynamic method" will be described with reference to the time chart of FIG. 2 and schematic views shown in FIGS. 3A through 3F.

It is assumed here that a wafer W to be treated has been placed on and suction-supported by the spin chuck 1, and that the solvent spray nozzle 17 has been moved to the supply position by the driving unit 23. For expediency of illustration, the schematic views of FIGS. 3A through 3F show the wafer W in circles and the photoresist solution in hatched regions.

First, the spin motor 3 is started. Specifically, the controller 31 rotates the spin motor 3 forward to attain the rotational frequency R1 (e.g. 100 rpm) at the point of time t1. At the point of time tPS, after the spin of wafer W stabilizes at the rotational frequency R1, the electromagnetic switch valve 21 is opened to supply the solvent from the solvent spray nozzle 17 in mist. At the point of time $t_{PE}$, the electromagnetic switch valve 21 is closed to stop supplying the solvent. As a result, the solvent is applied thinly and uniformly over the entire surface of wafer W.

The period from point of time $t_{PS}$ to point of time $t_{PE}$ corresponds to a solvent spraying period $T_{PSU}$. The quantity of the solvent supplied during this period is 0.3 ml, for example.

The solvent is sprayed over the entire surface of wafer W, as noted above, before applying the photoresist solution. This step allows the photoresist solution subsequently supplied to the wafer surface to spread extremely smoothly over the wafer surface. Moreover, since the solvent is supplied not in droplets but in mist, the surface of the wafer W is covered uniformly with a small quantity of solvent. Even if recesses such as of a circuit pattern are formed on the surface of wafer W, the solvent is prevented from stagnating in such portions. After the point of time $t_{PE}$ when the solvent supply is stopped, the driving unit 23 moves the solvent spray nozzle 17 to the standby position. In place thereof, the driving unit 15 moves the coating solution supply nozzle 11 to the supply position.

The above rotational frequency R1 corresponds to the first rotational frequency of the present invention. The process from point of time $t_{PS}$ to point of time $t_{PE}$ corresponds to step (a) of the present invention.

Next, the rotational frequency of wafer W is increased at the point of time t2 to attain the rotational frequency R2 (e.g. 1000 rpm) at the point of time t3. At the point of time $t_S$, after the spin of wafer W stabilizes at the rotational frequency R2, the photoresist solution begins to be supplied at a fixed flow rate from the coating solution supply nozzle 11. At the point of time $t_E$ marking the end of the supplying period $T_S$ started at the point of time $t_S$, the supply of the photoresist solution is stopped. That is, the spin of wafer W is maintained at the rotational frequency R2 from point of time t3 to point of time t4, and the supply of the photoresist solution is completed during this period (dynamic method). The above rotational frequency R2 corresponds to the second rotational frequency of the present invention. The process from point of time $t_S$ to point of time $t_E$ corresponds to step (b) of the present invention.

Figure 3A:
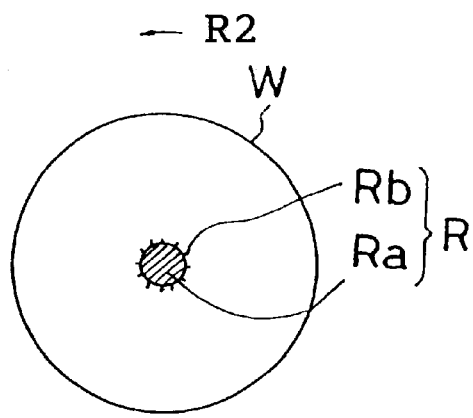
FIGS. 3A through 3F are explanatory views of the photoresist applying method.

The photoresist solution supplied to the surface of wafer W spinning at the rotational frequency R2 is present, at the point of time $t_S$, around the spin center of wafer W in the form of a circular drop Ra (hereinafter called core Ra) in plan view (FIG. 3A). The centrifugal force generated by the spin at the rotational frequency R2 spreads the core Ra concentrically toward the edge of wafer W while allowing the core Ra substantially to retain the circular shape.

The core Ra retains the circular shape for a while, and thereafter undergoes conspicuous changes in shape.

Figure 3B:
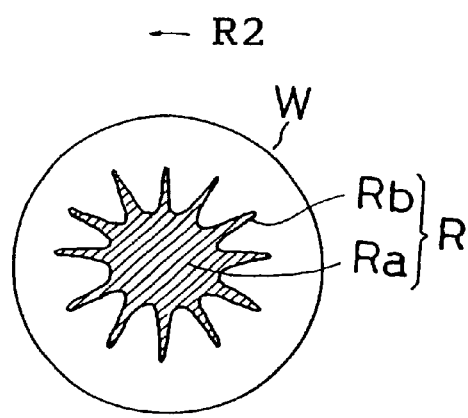

Specifically, the photoresist solution R begins to flow in a plurality of rivulets Rb (hereinafter called fingers Rb) extending radially from the edge of circular core Ra toward the edge of wafer W (FIGS. 3A and 3B). These numerous fingers Rb, by the centrifugal force, continue to grow toward the edge of wafer W with an increase in the diameter of core Ra. The fingers Rb have a larger radius, and are therefore subjected to a greater centrifugal force, than the core Ra. Consequently, the fingers Rb grow toward the edge of wafer W faster than the enlargement of core Ra (FIG. 3B).

Before the entire surface of wafer W is covered by the photoresist solution R, the spin of wafer W is accelerated from the rotational frequency R2 (1000 rpm) to the higher rotational frequency R3 (e.g. 2500 rpm) (at the point of time t4). At this time, the spin is controlled to begin accelerating at the point of time t4 to reach the rotational frequency R3 at the point of time t5. This period of acceleration is approximately 0.1 sec., for example. The rotational frequency R3 corresponds to the third rotational frequency of the present invention. The process from point of time t4 to point of time t5 corresponds to step (c) of the invention.

By rapidly accelerating the spin of wafer W from rotational frequency R2 to rotational frequency R3 in this way, a force of inertia due to the acceleration for increasing the rotational frequency and a centrifugal force due to the high-speed spin act on the fingers Rb which would otherwise extend linearly toward the edge of wafer W. The resultant of inertia and centrifugal force bends the fingers Rb circumferentially, thereby enlarging widths thereof (FIG. 4). In addition, the diameter of core Ra increases (FIGS. 3C and 4).

Since the solvent has been applied to the entire surface of wafer W beforehand as noted above, the photoresist solution R has a very small angle of contact with the surface of wafer W. Consequently, in the above step, the diameter of core Ra increases quickly and, though omitted from the schematic views, the fingers Rb are formed more thinly and in a greater number than in the prior art. The fingers Rb easily bend under the force of inertia.

Figure 3C:
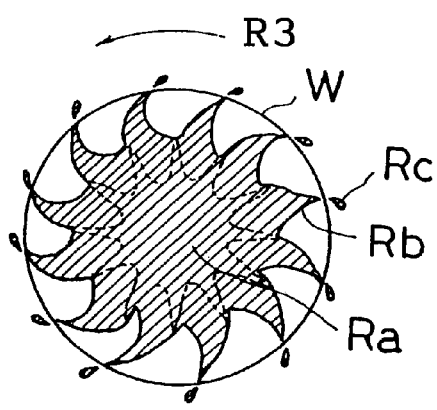
Figure 3D:
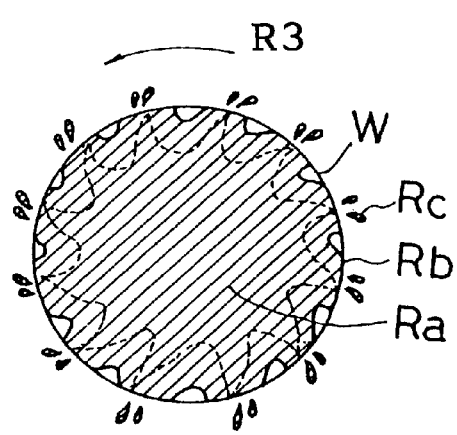
Figure 3E:
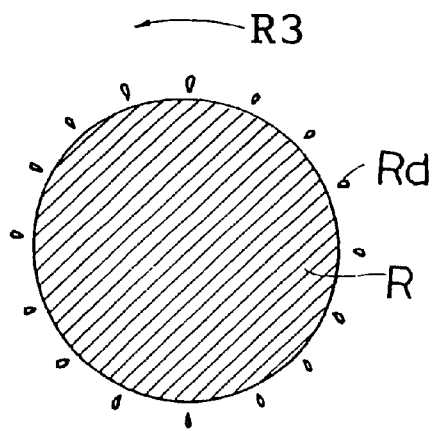
Figure 3F:
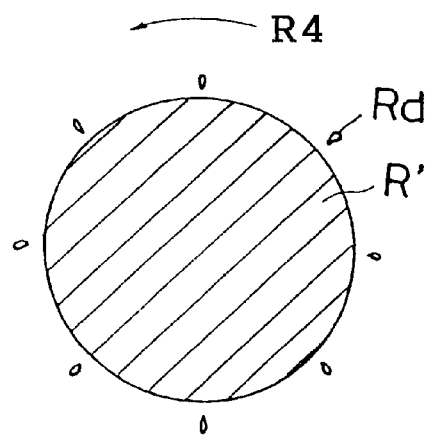
Figure 4:
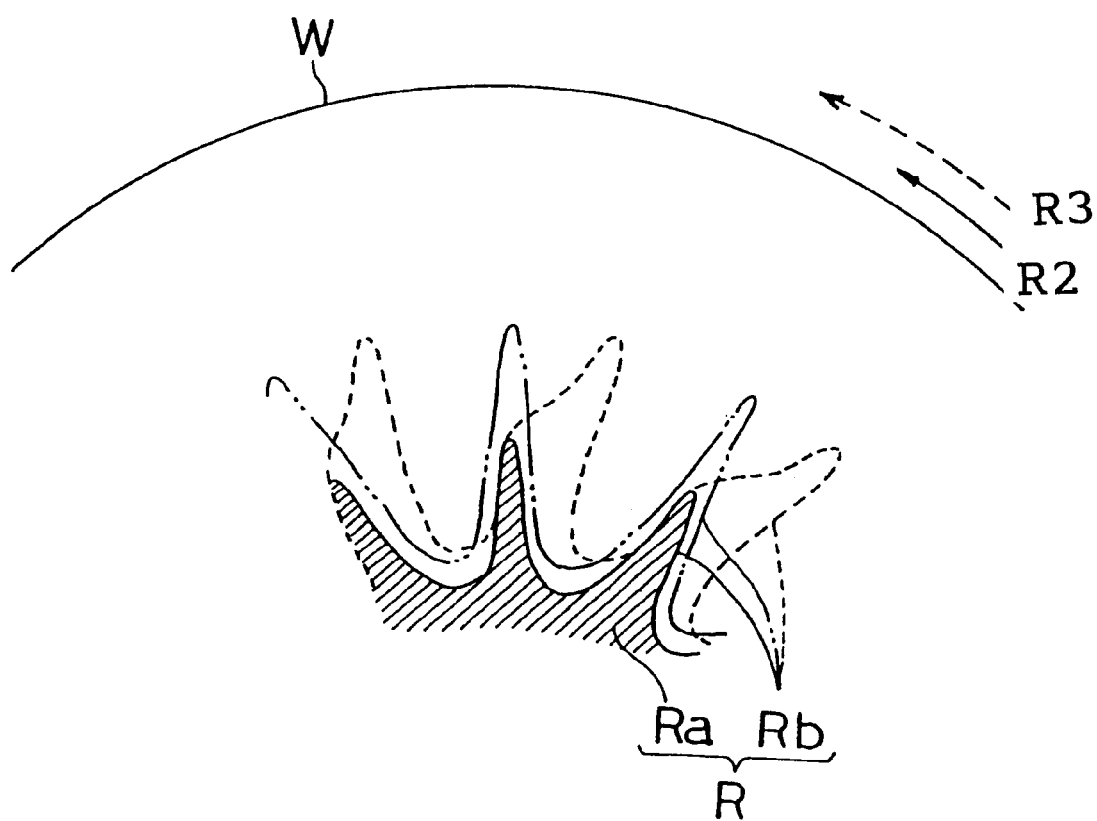
FIG. 4 is a schematic view showing a behavior of a photoresist solution.

When leading ends of fingers Rb reach the edge of wafer W as shown in FIG. 3C, the photoresist solution R flows through the fingers Rb to scatter from the wafer W to the ambient (in scattering photoresist solution Rc). However, since the fingers Rb are bent circumferentially by the acceleration, the core Ra and fingers Rb grow and spread in unison toward the edge of wafer W. Thus, the time taken for the photoresist solution R to cover the entire surface of wafer W is much shorter than in the prior art (FIGS. 3C–3E).

In this way, the entire surface of the wafer W is covered by the photoresist solution R. At the point of time t7, the spin of wafer W is decelerated to the rotational frequency R4 (e.g. 1500 rpm). By maintaining this rotational frequency R4 from point of time t7 to point of time t8, a small, superfluous part of photoresist solution R covering the surface of wafer W is dispelled (as excess photoresist solution Rd). As a result, a photoresist film R' is formed in a desired thickness on the surface of wafer W. The above rotational frequency R4 corresponds to the fourth rotational frequency of the present invention. The process from point of time t7 to point of time t8 corresponds to step (d) of the present invention.

As described above, the solvent is applied to the wafer W before supplying the photoresist solution R thereto to reduce the angle of contact between the photoresist solution R and the surface of wafer W. Consequently, the diameter of the core Ra of photoresist solution R supplied afterward may be enlarged easily, and numerous thin fingers Rb may be formed to extend from the core Ra toward the edge of wafer W. Since the solvent is supplied in sprays before the photoresist solution, the solvent can cover a wide range in a short time. Even if recesses of a circuit pattern have been formed on the surface of wafer W, the solvent hardly stagnates in such portions. The photoresist film formed is free from irregularities due to the solvent.

As noted hereinbefore, the spin of wafer W is accelerated from rotational frequency R2 (second rotational frequency) to rotational frequency R3 (third rotational frequency) before the entire surface of wafer W is covered by the photoresist solution R to apply a force of inertia to the fingers Rb. With the reduced angle of contact, the numerous thin fingers Rb are bent to large degrees in a circumferential direction to increase their width greatly. Thus, the time taken for the photoresist solution R to cover the entire surface of wafer W is reduced significantly. Since only a short time is taken after the fingers Rb reach the edge of wafer W and before the supply of photoresist solution R is stopped, a reduced quantity of photoresist solution R scatters to the ambient through the fingers Rb. Consequently, a drastically reduced quantity of photoresist solution R is required to obtain the photoresist film R' of desire thickness. This is achieved while curbing consumption of the solvent.

In order to shorten the required coating time, it is desirable to increase the rotational frequency rapidly. That is, preferably, acceleration should be effected at a high rate by reducing the period from point of time t4 to point of time t5 (hereinafter called the rotational frequency switching period) in the time chart of FIG. 2. It has been found through experiment, however, that an excessively rapid acceleration would result in an extended coating time to consume the photoresist solution wastefully.

In the experiment, the required coating time was measured by combining varied rotational frequency switching periods with the rotational frequency R4 and rotational frequency R5. It has been found that excellent results are obtained from acceleration effected in the range of 7,500–50,000 rpm/sec. It is therefore desirable to take the above preferred range of acceleration rates into account in setting the rotational frequency switching period from point of time t4 to point of time t5 and rotational frequencies R2 and R3 in the time chart of FIG. 2.

In the above description, the spin of wafer W is accelerated rapidly from rotational frequency R2 to rotational frequency R3 to apply a force of inertia to the fingers Rb, and is subsequently decelerated from rotational frequency R3 to rotational frequency R4 to adjust film thickness. Alternatively, the spin may first be accelerated from rotational frequency R2 to rotational frequency R3 which is lower than rotational frequency R4, and thereafter accelerated from rotational frequency R3 to rotational frequency R4 to adjust film thickness. Further, while the rotational frequency is described as being changed by a single stage from point of time t4, the rotational frequency may be increased by two or more stages.

"Static Method"

Next, a photoresist solution applying process by the "static method" will be described with reference to the time chart of FIG. 5. The apparatus used for executing this applying process has the same construction as shown in FIG. 1. Only the processing program stored in the memory 33 is different in the following respects.

First, the solvent is sprayed to a wafer W suction-supported by the spin chuck 1 without driving the spin motor 3, i.e. with the wafer W maintained still (first rotational frequency R1=0). Specifically, at the point of time $t_{PS}$, the solvent begins to be sprayed from the solvent spray nozzle 17 to the surface of wafer W. The driving unit 23 moves the spray gun 17a so that the solvent covers the entire surface of wafer W in the solvent spraying period $T_{PSU}$ ending at the point of time $t_{PE}$. The process from point of time $t_{PS}$ to point of time $t_{PE}$ corresponds to step (a) of the present invention.

Next, at the point of time $t_S$, the photoresist solution begins to be supplied from the coating solution supply nozzle 11. The supply of the photoresist solution is stopped upon lapse of the supplying period $T_{SU}$ at the point of time $t_E$. That is, the supply of the photoresist solution is completed while the wafer W is maintained still (static method). In the course of the above process, as shown in the schematic view of FIG. 3A, the photoresist solution forms a core Ra around the spin center of wafer W. The core Ra, while substantially retaining its circular shape, increases in diameter (not shown) as the photoresist solution continues to be supplied. The process from point of time $t_S$ to point of time $t_E$ corresponds to step (b) of the present invention.

At the point of time $t_E$, the supply of the photoresist solution is stopped, and the wafer W is spun at a rate increasing to the rotational frequency R2 (second rotational frequency). This rotational frequency is maintained from point of time t1 to point of time t2. Then, at the point of time t2, an acceleration of the spin of wafer W is started to reach the rotational frequency R3 (third rotational frequency) at the point of time t3. The point of time t2 is set to be before the entire surface of wafer W is covered by the photoresist solution supplied thereto and spread by the spin of wafer W at the second rotational frequency R2. The process from point of time t2 to point of time t3 corresponds to step (c) of the present invention.

During this step, the photoresist solution exhibits a behavior similar to that occurring in the "dynamic method" described hereinbefore. That is, at the point of time $t_E$ when the spin begins to be accelerated toward the rotational frequency R2, numerous fingers Rb develop from the edge of core Ra and begin to extend toward the edge of wafer W (FIG. 3B). As the spin of wafer W is accelerated rapidly from rotational frequency R2 to rotational frequency R3, a force of inertia acts to bend the fingers Rb by large degrees circumferentially, thereby enlarging widths thereof (FIGS. 3C and 4). This shortens the coating time required for the photoresist solution R to cover the entire surface of wafer W. As in the "dynamic method" described hereinbefore, since the solvent has been applied to the entire surface of wafer W beforehand whereby the photoresist solution R has a reduced angle of contact with the surface of wafer W, the diameter of core Ra increases quickly and the fingers Rb are formed more thinly and in a greater number than in the prior art.

The rotational frequency R3 is maintained until point of time t4, and thereafter the spin of wafer W is decelerated to the rotational frequency R4 (fourth rotational frequency). The rotational frequency R4 is maintained from point of time t5 to point of time t6 to adjust the thickness of a photoresist film formed. Such rotational frequency controls achieve a reduced coating time and a reduced quantity of photoresist solution R scattering from the wafer W through the fingers Rb. Consequently, a reduced quantity of photoresist solution is required to obtain a photoresist film of desired thickness. The process from point of time t5 to point of time t6 corresponds to step (d) of the present invention.

Preferably, the above rotational frequency switching period (t2–t3) is set along with the rotational frequencies R2 and R3 to provide the rate of acceleration noted in the "dynamic method".

Figure 5:
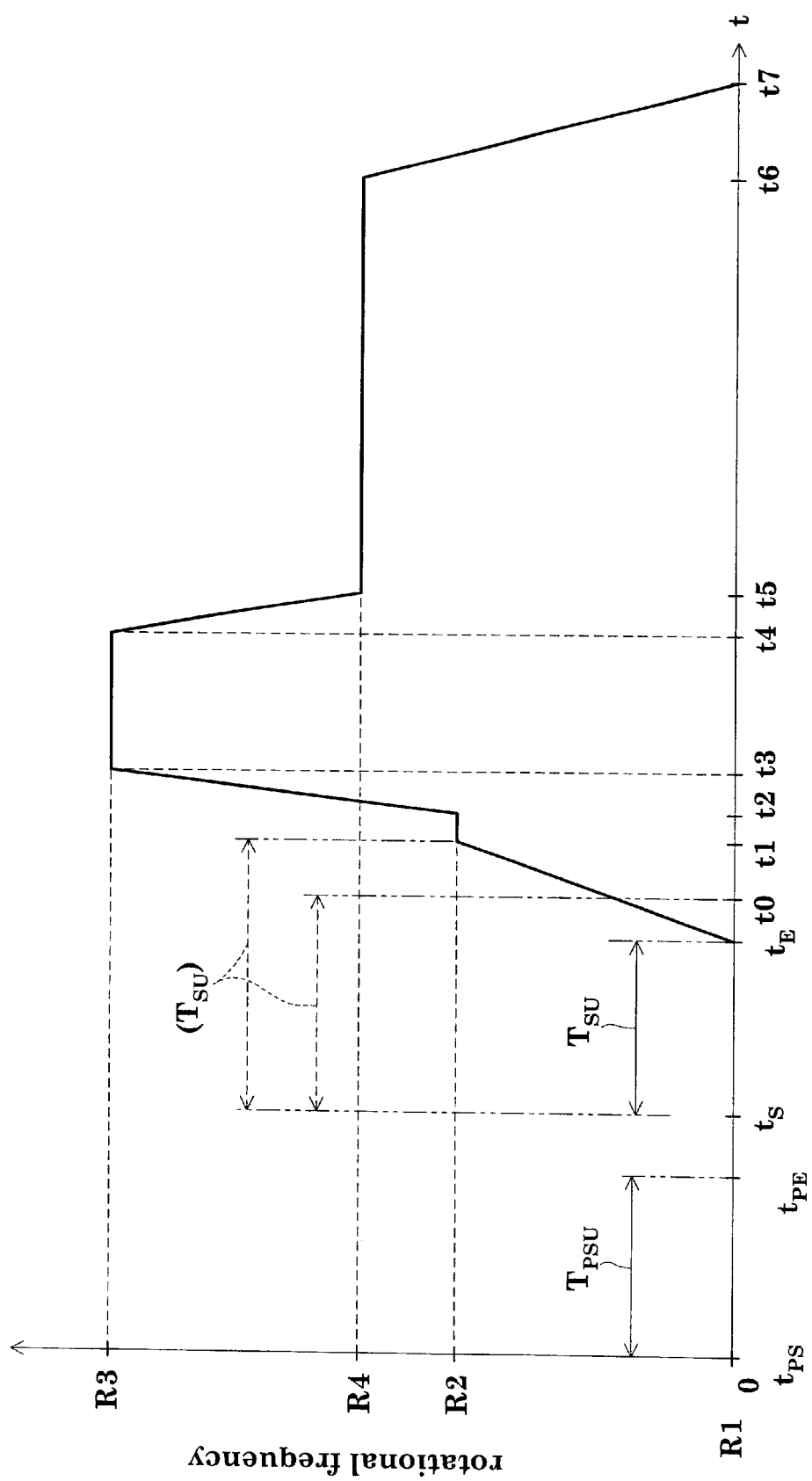
FIG. 5 is a time chart showing other photoresist applying methods (static method and stamic method) in the first embodiment.

The point of time $t_E$ for stopping the supply of the photoresist solution in the "static method" is not limited to the point of time shown in the time chart of FIG. 5. The supply may be stopped at any appropriate time as long as the wafer W is maintained still. Thus, the point of time $t_E$ may be set within a range from the supply starting point of time $t_S$ to the point of time for accelerating the spin toward the rotational frequency R2.

As described in the "dynamic method", the spin may be accelerated by two or more stages. In the coating process based on the "dynamic method", the solvent is supplied to the wafer W in a spin, but of course the solvent may be supplied to the wafer W maintained still as in the "static method". Similarly, in the "static method", the solvent may be supplied to the wafer W in a spin.

"Stamic Method"

Next, a photoresist solution applying process by the "stamic method" will be described with reference to the time chart of FIG. 5. This method may be said a combination of the dynamic method and static method described hereinbefore.

That is, the supply of the photoresist solution is started while the wafer W is maintained still (i.e. start of supply in the static method), and is stopped after the wafer W is started spinning (i.e. finish of supply in the dynamic method).

As in the preceding methods, the solvent is sprayed before applying the photoresist solution to reduce the angle of contact of the photoresist solution with the surface of wafer W. At the point of time $t_S$, the photoresist solution begins to be supplied. At the point of time $t_E$, while the supply of the photoresist solution is continued, the wafer W is spun at a rate increasing to the rotational frequency R2 (second rotational frequency). The supply of the photoresist solution is stopped at the point of time t1 when the spin reaches the rotational frequency R2. In other words, the spin of wafer W is started during the supplying period ($T_{SU}$). In this case, the process from point of time $t_S$ to point of time t1 corresponds to step (b) of the present invention.

Before the photoresist solution covers the entire surface of wafer W, and more particularly between point of time t2 and point of time t3, the spin of wafer W is accelerated rapidly from rotational frequency R2 to rotational frequency R3 (third rotational frequency). This acceleration bends, by large degrees circumferentially, the numerous thin fingers Rb extending from the core Ra concentrically spreading by the effect of the solvent applied. As a result, only a reduced quantity of photoresist solution R scatters from the wafer W through the fingers Rb. Subsequently, the rotational frequency R3 (third rotational frequency) is maintained from point of time t3 to point of time t4 to form a photoresist film of desired thickness. Thus, as in the coating processes based on the "dynamic method" and "static method", while curbing consumption of the solvent, a photoresist film of desired thickness may be formed with a reduced quantity of photoresist solution.

The point of time for stopping the supply of the photoresist solution is not limited to the point of time t1 when the spin reaches the rotational frequency R2 as shown in the time chart of FIG. 5. The supply may be stopped at any appropriate time after the wafer W is started spinning. As shown in a dotted line arrow, for example, the supply may be stopped at a point of time t0 between the point of time $t_E$ for starting the spin of wafer W toward the second rotational frequency R2 and the point of time when the spin reaches the rotational frequency R2.

The rotational frequency switching period (t2–t3) may be set as in the "static method" described hereinbefore.

The spin of wafer W in time of spraying the solvent, and the rotational frequency switching stages in time of acceleration, may be modified as described in the "static method".

Second Embodiment

"Dynamic Method"

Figure 6:
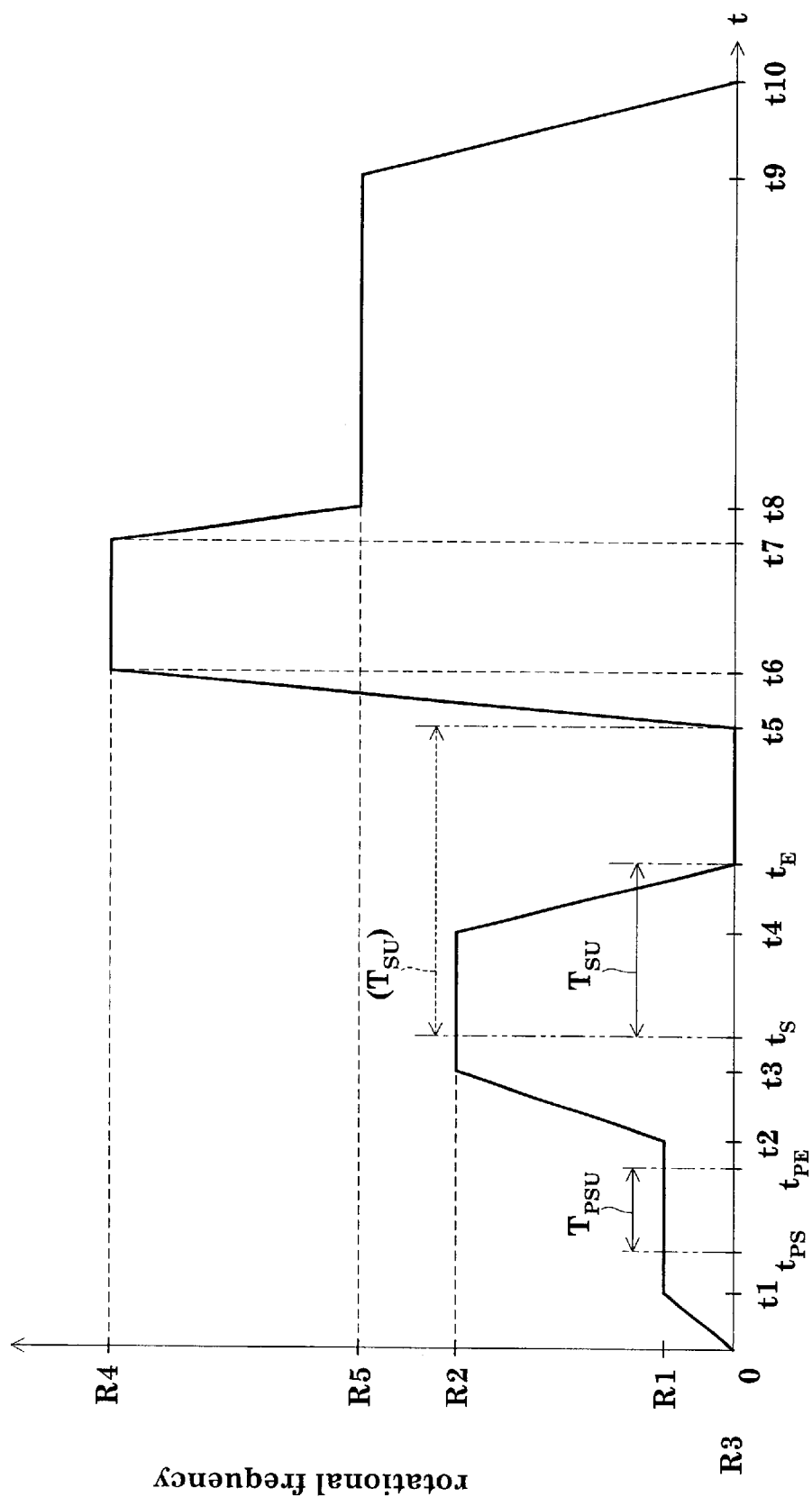
FIG. 6 is a time chart showing a photoresist applying method (dynamic method) in a second embodiment of the invention.

Next, methods different from those in the first embodiment will be described with reference to the time chart of FIG. 6. This embodiment differs from the first embodiment in that, after starting the supply of the photoresist solution to the wafer W, the spin of wafer W is temporarily "decelerated".

The apparatus has substantially the same construction except the processing program stored in the memory 33, and will not be described again.

First, the spin motor 3 is started at the time origin. A control is effected to attain the rotational frequency R1 (which is 100 rpm, for example, and corresponds to the first rotational frequency) at the point of time t1. At the point of time $t_{PS}$ after the spin of wafer W stabilizes at the rotational frequency R1, the solvent begins to be sprayed from the solvent spray nozzle 17. The spraying is stopped upon lapse of the solvent spraying period $T_{PSU}$ at the point of time $t_{PE}$.

Subsequently, the spin of wafer W is accelerated at the point of time t2 to attain the rotational frequency R2 (which is 1000 rpm, for example, and corresponds to the second rotational frequency) at the point of time t3. At the point of time $t_S$ after the spin of wafer W stabilizes at the rotational frequency R2, the photoresist solution begins to be supplied from the coating solution supply nozzle 11 to a region around the spin center of wafer W. As noted hereinbefore, the centrifugal force generated by the spin enlarges the core Ra concentrically (FIG. 3A) and starts fingers Rb to extend from the edge of core Ra (FIG. 3B). Before the photoresist solution R spreading in this way covers the entire surface of wafer W, specifically at the point of time t4, the spin of wafer W begins to be decelerated to reach the rotational frequency R3 (which is 0 rpm, for example, and corresponds to the third rotational frequency of the present invention) at the point of time $t_E$ when the supply of the photoresist solution is stopped. In this example, the rotational frequency R3 is 0 rpm, and thus the wafer W stands still. This decelerated (resting) state is maintained until the point of time t5.

The process from point of time $t_{PS}$ to point of time $t_{PE}$ corresponds to step (a) of the present invention. The process from point of time $t_S$ to point of time $t_E$ corresponds to step (b). The process from point of time $t_E$ to point of time t5 corresponds to step (c).

Immediately after the point of time $t_S$ when the photoresist solution begins to be supplied, the photoresist solution is present around the spin center of wafer W in the form of core Ra. As the photoresist solution continues to be supplied, the centrifugal force generated by the spin at the rotational frequency R2 spreads the core Ra concentrically toward the edge of wafer W while allowing the core Ra substantially to retain the circular shape. Since the solvent has been sprayed beforehand, the diameter of core Ra increases more quickly than in the prior art.

Figure 7:
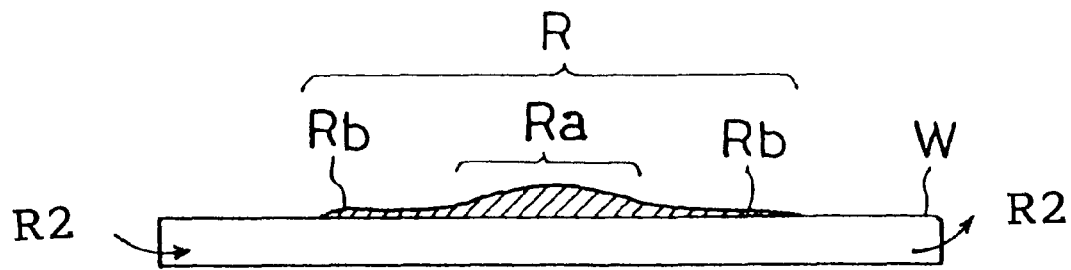
FIG. 7 is a schematic side view showing a behavior of the photoresist solution.

The core Ra retains the circular shape for a while. Then, as shown in FIGS. 3A and 3B, the centrifugal force generated by the spin at the rotational frequency R2 develops numerous fingers Rb which begin to extend radially from the edge of circular core Ra toward the edge of wafer W. Due to the action of the solvent, as noted hereinbefore, these fingers Rb are formed more thinly and in a greater number than in the prior art. Further, as noted hereinbefore, the fingers Rb grow toward the edge of wafer W faster than the core Ra. FIG. 7 is a side view schematically showing this state.

Figure 8:
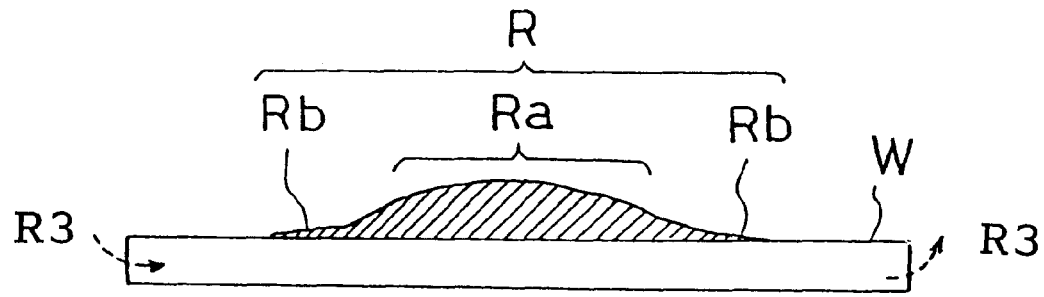
FIG. 8 is another schematic side view showing the behavior of the photoresist solution.

As noted hereinbefore, the wafer W is stopped spinning (i.e. spun at the rotational frequency R3=0) before the photoresist solution R supplied to the surface of wafer W covers the entire surface of wafer W. This step substantially and temporarily stops the growth of fingers Rb extending radially from the edge of core Ra toward the edge of wafer W and the increase in diameter of core Ra. The supply of photoresist solution R is continued until the point of time $t_E$ when the spin of wafer W is stopped. Consequently, as schematically shown in FIG. 8, the quantity of photoresist solution R is increased only in respect of the core Ra. With the increased volume, the core Ra itself gains increased momentum for growth. Besides, the temporary lowering of rotational frequency diminishes the influence of turbulence which would occur around the edge of wafer W, if the latter continued to spin, to cause non-uniformity in the thickness of photoresist film.

When the wafer W is kept spinning at the photoresist supplying rotational frequency R2 as in the prior art, with the core Ra given increased momentum for growth, the photoresist solution R exhibits the following behavior.

Figure 9:
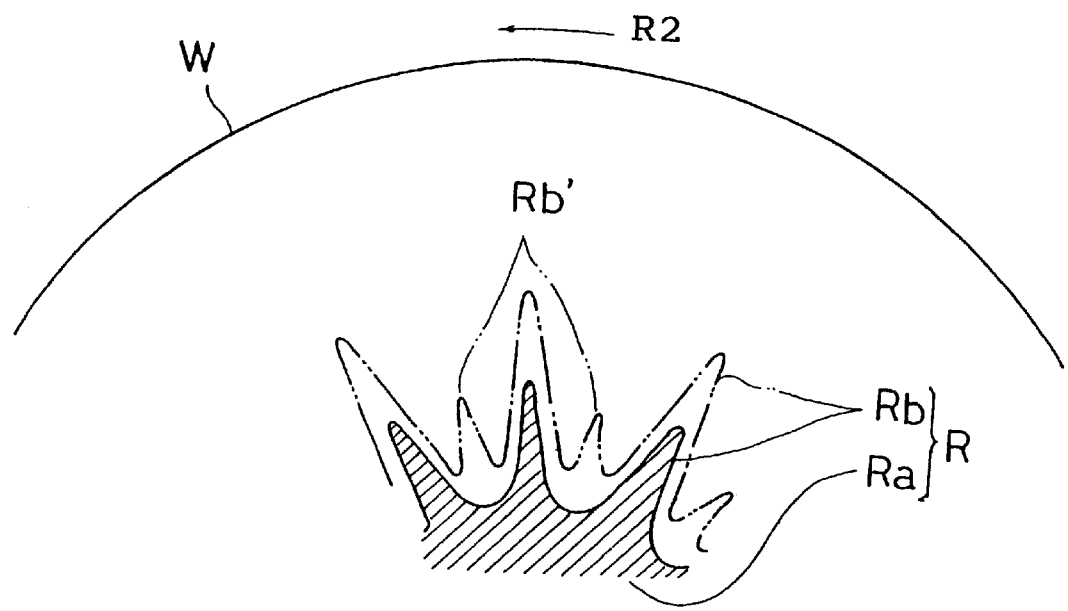
FIG. 9 is a schematic plan view showing the behavior of the photoresist solution.

From the state shown in hatches in FIG. 9, the core Ra and fingers Rb grow and extend under the centrifugal force toward the edge of wafer W as shown in a two-dot chain line. Besides, new radial rivulets Rb' (hereinafter referred to as new fingers Rb') develop from the core R having increased in volume and thus increased momentum for growth. These new fingers Rb' begin to extend linearly from between the numerous fingers Rb toward the edge of wafer W.

Before the photoresist solution R covers the entire surface of wafer W, specifically at the point of time t5, the rotational frequency of wafer W is increased from the rotational frequency R3 (0 rpm) to the rotational frequency R4 (which is 2500 rpm, for example, and corresponds to the fourth rotational frequency of the present invention). The spin is rapidly accelerated to reach the rotational frequency R4 at the point of time t6. As a result of this acceleration, the photoresist solution R with the core Ra having maximized momentum for growth undergoes the action set out hereunder to develop the new fingers Rb' efficiently and enlarge the diameter of core Rb at an increased rate. The process from point of time t5 to point of time t6 corresponds to step (d) of the present invention.

Figure 10:
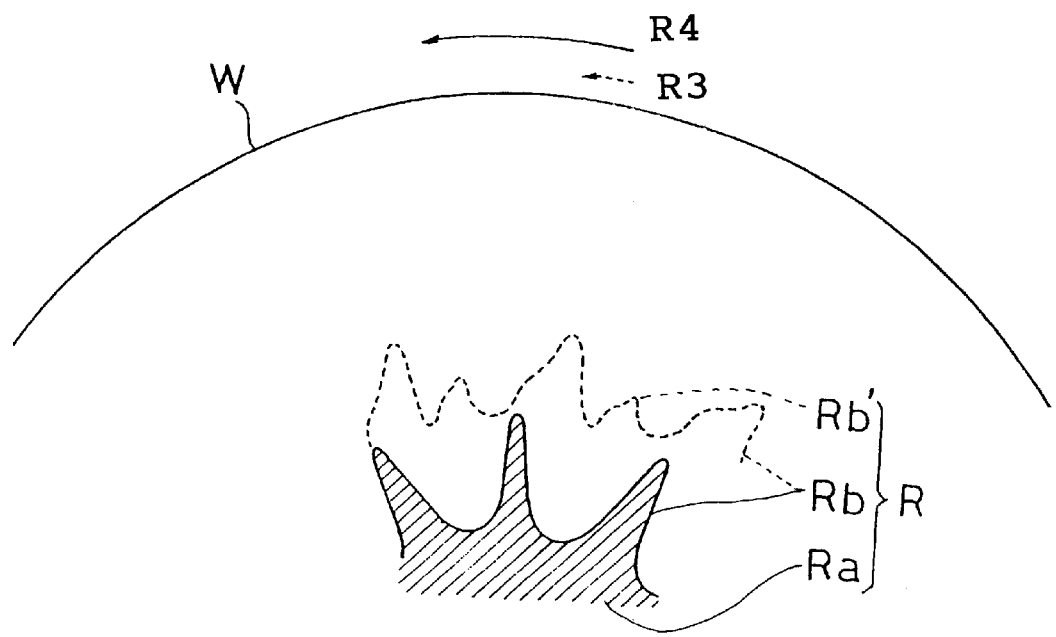
FIG. 10 is another schematic plan view showing the behavior of the photoresist solution.
Figure 11:
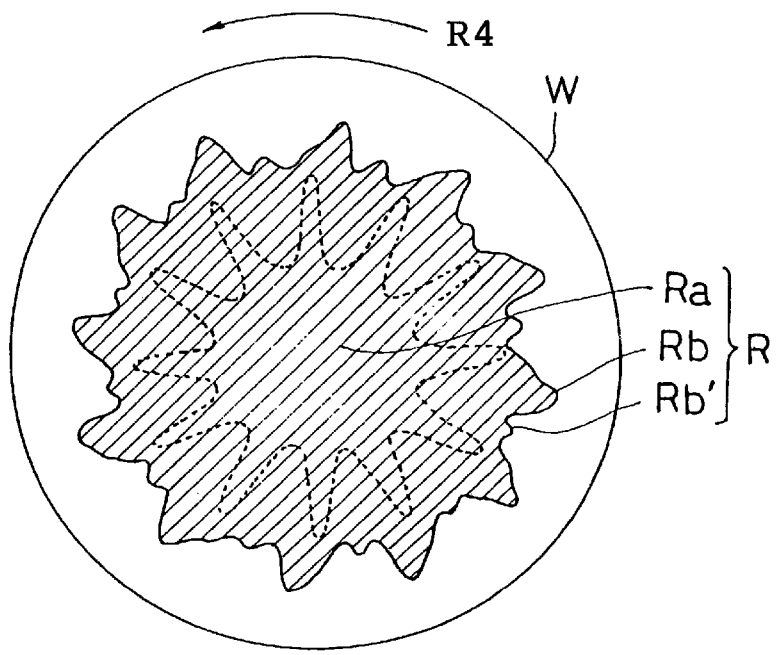
FIG. 11 is a further schematic plan view showing the behavior of the photoresist solution.

In the state shown in FIG. 9, the fingers Rb and new fingers Rb' are subjected to a force of inertia, i.e. a force acting in the direction opposite to the direction of spin. The resultant of centrifugal force and inertia bends the fingers Rb and new fingers Rb' circumferentially, thereby enlarging widths thereof, as shown in FIGS. 10 and 11. The leading ends of the fingers Rb and new fingers Rb' extend under the centrifugal force toward the edge of wafer W. In addition, the diameter of core Ra increases. Since the solvent has been sprayed beforehand, the fingers Rb and new fingers Rb' are bent to greater degrees circumferentially, and the widths thereof increase to greater extents, than in the prior art.

Figure 12:
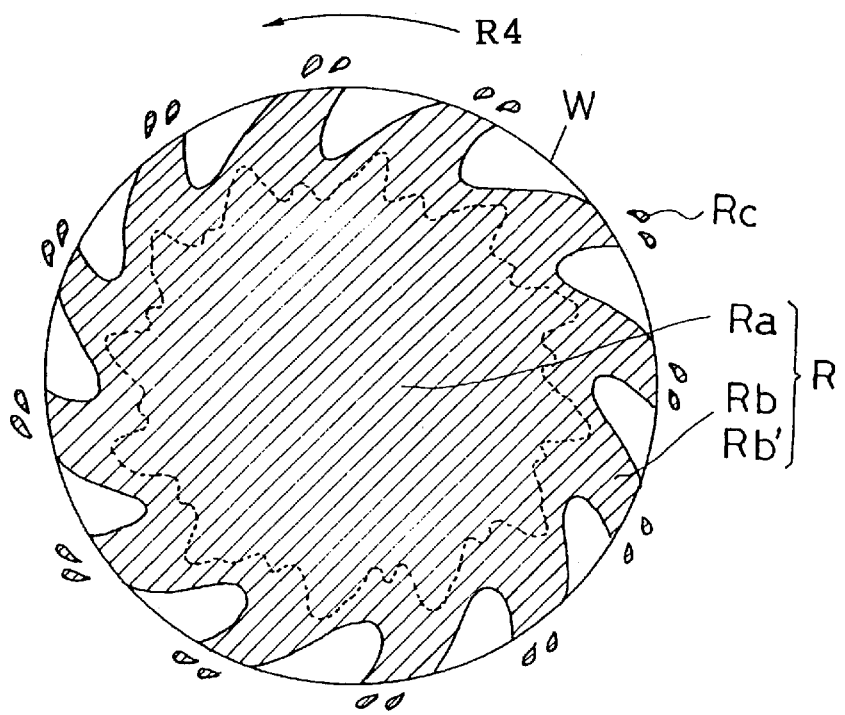
FIG. 12 is a still further schematic plan view showing the behavior of the photoresist solution.
Figure 13:
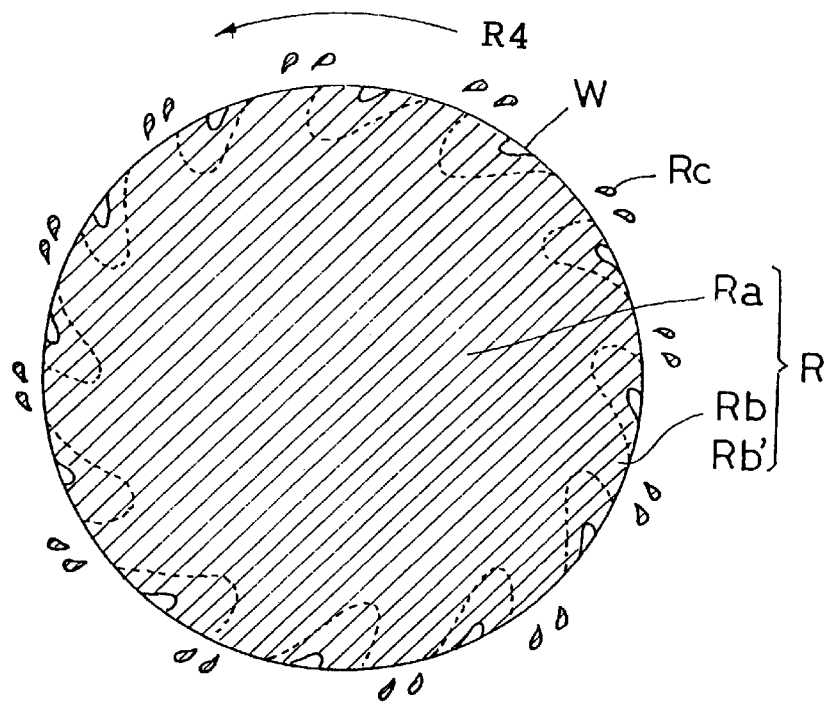
FIG. 13 is a still further schematic plan view showing the behavior of the photoresist solution.
Figure 14:
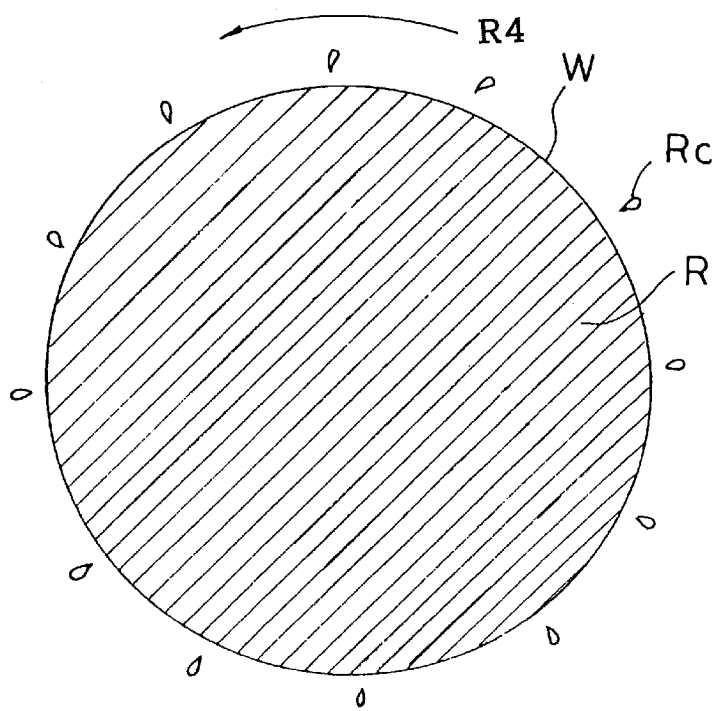
FIG. 14 is a still further schematic plan view showing the behavior of the photoresist solution.

When the leading ends of numerous fingers Rb and new fingers Rb' reach the edge of wafer W as shown in FIG. 12, the photoresist solution R scatters from these leading ends outwardly of wafer W (in scattering photoresist solution Rc). However, since the fingers Rb and new fingers Rb' are bent to large degrees circumferentially owing to the acceleration, the core Ra, fingers Rb and new fingers Rb' grow and spread in unison toward the edge of wafer W. Thus, the time taken for the photoresist solution to cover the entire surface of wafer W is much shorter than in the prior art (FIGS. 12 through 14).

With the photoresist solution R acting as above, the spin of wafer W is decelerated during the period between point of time t7 to point of time t8 from rotational frequency R4 to rotational frequency R5 (which is 1500 rpm, for example, and corresponds to the fifth rotational frequency of the present invention). By maintaining this rotational frequency R5 until point of time t9, a small, superfluous part of photoresist solution R covering the surface of wafer W is dispelled to form a photoresist film in a desired thickness over the entire surface of wafer W. The process from point of time t8 to point of time t9 corresponds to step (e) of the present invention.

As described above, the solvent is applied before supplying the photoresist solution to reduce the angle of contact between the photoresist solution and the surface of wafer W. Consequently, the diameter of the core Ra of the photoresist solution supplied to the surface of wafer W afterward may enlarge easily. Since the solvent is supplied in sprays before the photoresist solution is supplied, the solvent can cover a wide range in a short time. The solvent hardly stagnates in rugged portions of wafer W. The photoresist film formed is free from irregularities due to the solvent.

As described above, before the entire surface of wafer W is covered by the photoresist solution R, the wafer W is temporarily stopped spinning to stop the increase in diameter of core Ra and the growth of fingers Rb. In this state, the photoresist solution is given increased spreading momentum. Then, the rotational frequency is rapidly increased to facilitate development of thin, numerous new fingers Rb'. These new fingers Rb' as well as fingers Rb are subjected to a strong force of inertia to increase their widths while being bent circumferentially. At this time, the action of the solvent promotes the increase in width of the fingers Rb and Rb' while circumferentially bending the fingers Rb and Rb' at an increased rate. A reduced quantity of photoresist solution scatters to the ambient after the fingers Rb (and new fingers Rb') reach the edge of wafer W. Consequently, a drastically reduced quantity of photoresist solution is required to obtain the photoresist film of desire thickness. This is achieved while curbing consumption of the solvent.

The rotational frequency switching period (t5–t6) may be set by taking into account the period of deceleration (resting) $t_E$–t5 in addition to the various conditions noted above.

In order to increase the spreading momentum of core Ra in this embodiment, it is essential to continue supplying the photoresist solution at least from the start of deceleration to the time the third rotational frequency R3 is attained. However, it is not absolutely necessary to stop the supply of the photoresist solution, as in the described example, at the point of time $t_E$ when the third rotational frequency R3 is attained. The supply of the photoresist solution may be extended to the accelerating point of time t5, including the period of deceleration, as shown in a dotted line arrow and a supplying period ($T_{SU}$) in FIG. 6.

In the foregoing example, the solvent is sprayed to the wafer W in a spin. Instead, as described hereinafter, the solvent may be sprayed to the wafer W maintained still.

The coating process in the second embodiment is characterized by the feature of decelerating the spin before the photoresist solution R covers the entire surface of wafer W as a result of the spin. There is no coating process based on the "static method" in which the supply of photoresist solution R is started and stopped while the wafer W is maintained still. Thus, the stamic method combining the static method and dynamic method will be described next with reference to the flow chart of FIG. 15.

"Stamic Method"

First, at the point of time $t_{PS}$, the solvent is sprayed from the solvent spray nozzle 17 over the entire surface of a wafer W maintained still. The spraying is stopped upon lapse of the solvent spraying period $T_{PSU}$ at the point of time $t_{PE}$. The process from point of time $t_{PS}$ to point of time $t_{PE}$ corresponds to step (a) of the present invention.

Subsequently, at the point of time $t_S$, the photoresist solution begins to be supplied from the supply nozzle 11 while the wafer W is maintained still. At the point of time t1, the wafer W is spun at an increasing rate to reach the rotational frequency R2 at the point of time t2. This rotational frequency R2 is maintained until the point of time t3. Then, the spin of wafer W is decelerated to reach the rotational frequency R3 (which is 100 rpm, for example, and corresponds to the third rotational frequency of the present invention) at the point of time t4 which is before the supplying period $T_{SU}$ expires. This decelerated state is maintained until the point of time $t_E$ which is the end of the supplying period $T_{SU}$ lasting from the point of time $t_S$. The supply of the photoresist solution is stopped, and the spin of wafer W is rapidly accelerated toward the rotational frequency R4 (corresponding to the fourth rotational frequency). The decelerating period t4–$t_E$ and accelerating period $t_E$–t5 are set to occur before the photoresist solution spreads over the entire surface of wafer W. The process from point of time $t_S$ to point of time $t_E$ corresponds to step (b) of the present invention. The process from point of time t3 to point of time $t_E$ corresponds to step (c). The process from point of time $t_E$ to point of time t5 corresponds to step (d).

With the photoresist solution supplied to the surface of wafer W in this way, as in the "stamic method" in the first embodiment, fingers Rb are developed while the core Ra increases in diameter (FIGS. 3A and 3B). By decelerating the spin of wafer W (to rotational frequency R3=100 rpm) at that point of time, the growth of fingers Rb and the increase in diameter of core Ra are stopped substantially and temporarily, as described in the "dynamic method" in this embodiment. The quantity of photoresist solution R is increased only in respect of the core Ra, whereby the core Ra gains increased momentum for growth (FIGS. 7 and 8).

During the accelerating period ($t_E$–t5), the photoresist solution is subjected to the action described in the "dynamic method" in this embodiment, whereby the required coating time is drastically reduced owing to the fingers Rb and new fingers Rb'. Further, since the solvent is sprayed beforehand to reduce the angle of contact, the diameter of core Ra increases more quickly in the respective stages than in the prior art. The fingers Rb and new fingers Rb' are formed thinly and in a large number, with widths greatly enlarging circumferentially under a force of inertia.

After the accelerating period, at the point of time t6, a deceleration is started so that the spin of wafer W is reduced to the rotational frequency R5 (corresponding to the fifth rotational frequency of the invention) at the point of time t7. By maintaining this rotational frequency R5 until point of time t8, a small, superfluous part of photoresist solution R covering the entire surface of wafer W is dispelled to form a photoresist film in a desired thickness over the entire surface of wafer W. The process from point of time t7 to point of time t8 corresponds to step (e) of the present invention. Since the required coating time is shortened as noted above, a reduced quantity of photoresist solution flows through the fingers Rb (and new fingers Rb') to scatter to the ambient. Consequently, a drastically reduced quantity of photoresist solution is required to obtain a photoresist film of desire thickness.

The rotational frequency switching period ($t_E$–t5) may be set by taking various conditions into account as noted in the "dynamic method" in this embodiment.

Figure 15:
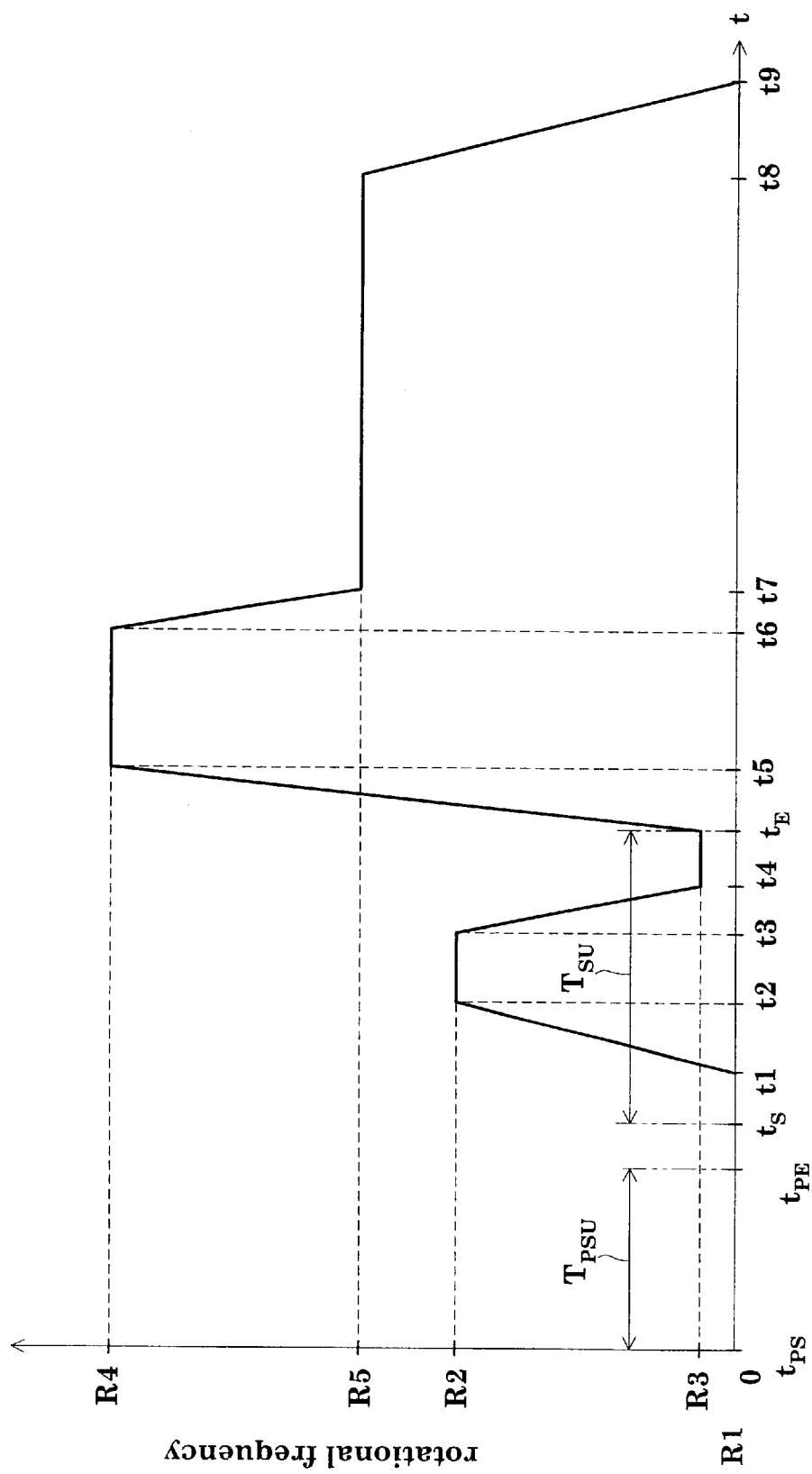
FIG. 15 is a time chart showing another photoresist applying method (stamic method) in the second embodiment.

The period $T_{SU}$ for supplying the photoresist solution may be shortened to the point of time t4, rather than what is illustrated in FIG. 15. The shortened period $T_{SU}$ will produce the same effect since the core's momentum for growth is still increased.

In the foregoing description, the rotational frequency after deceleration is 0 rpm or 100 rpm, for example. However, various other rotational frequencies may be selected as long as the enlargement of core Ra and growth of fingers Rb are temporarily checked and the influence of turbulence is suppressed.

The first and second embodiments have been described with the photoresist solution exemplifying the coating solution. The methods according to the present invention are applicable also where SOG solution or polyimide is used as the coating solution.

The present invention may be embodied in other specific forms without departing from the spirit or essential attributes thereof and, accordingly, reference should be made to the appended claims, rather than to the foregoing specification, as indicating the scope of the invention.

What is claimed is:

1. An apparatus for applying a coating solution to a surface of a substrate to form a coating film of desired thickness thereon, comprising:

rotary support means for supporting and spinning said substrate in horizontal posture;

solvent spray means for spraying a solvent to said substrate, said solvent spray means including a container for storing said solvent, a solvent spray nozzle communicating with said container and having a spray gun attached to a forward end thereof for spraying said solvent as mixed with a pressurized gas, and a drive unit for swinging said solvent spray nozzle between a standby position and a supply position, said drive unit being operable to swing said solvent spray nozzle supplied with a pressurized gas;

coating solution supply means for supplying said coating solution to said substrate;

storage means for storing a processing program including a first time for maintaining said substrate still or spinning said substrate at a first rotational frequency, a second time for spraying said solvent to said substrate, a third time for maintaining said substrate still or spinning said substrate at a second rotational frequency, a fourth time for supplying said coating solution to said substrate, a fifth time before said coating solution supplied to said substrate spreads and entirely covers said surface of said substrate, a sixth time for accelerating said substrate to a third rotational frequency, and a seventh time for maintaining said substrate at a fourth rotational frequency for a predetermined period;

timer means acting as a reference for each time stored in said storage means; and control means operable to perform controls with reference to said timer means for causing said rotary support means to handle said substrate for said first time, causing said solvent spray means to spray said solvent for said second time, causing said rotary support means to handle said substrate for said third time, causing said coating solution supply means to supply said coating solution for said fourth time, causing said rotary support means to accelerate said substrate to said third rotational frequency at said fifth time and said sixth time, and causing said rotary support means to maintain said fourth rotational frequency for said seventh time.

2. An apparatus for applying a coating solution to a surface of a substrate to form a coating film of desired thickness thereon, comprising:

rotary support means for supporting and spinning said substrate in horizontal posture;

solvent spray means for spraying a solvent to said substrate, said solvent spray means including a container for storing said solvent, a heater for heating said container to generate a vapor of said solvent, a solvent spray nozzle communicating with said container and having a spray gun attached to a forward end thereof, and a drive unit for swinging said solvent spray nozzle between a standby position and a supply position, said drive unit being operable to swing said solvent spray nozzle supplied with a pressurized gas;

coating solution supply means for supplying said coating solution to said substrate;

storage means for storing a processing program including a first time for maintaining said substrate still or spinning said substrate at a first rotational frequency, a second time for spraying said solvent to said substrate, a third time for maintaining said substrate still or spinning said substrate at a second rotational frequency, a fourth time for supplying said coating solution to said substrate, a fifth time before said coating solution supplied to said substrate spreads and entirely covers said surface of said substrate, a sixth time for accelerating said substrate to a third rotational frequency, and a seventh time for maintaining said substrate at a fourth rotational frequency for a predetermined period;

timer means acting as a reference for each time stored in said storage means; and control means operable to perform controls with reference to said timer means for causing said rotary support means to handle said substrate for said first time, causing said solvent spray means to spray said solvent for said second time, causing said rotary support means to handle said substrate for said third time, causing said coating solution supply means to supply said coating solution for said fourth time, causing said rotary support means to accelerate said substrate to said third rotational frequency at said fifth time and said sixth time, and causing said rotary support means to maintain said fourth rotational frequency for said seventh time.

3. An apparatus for applying a coating solution to a surface of a substrate to form a coating film of desired thickness thereon, comprising:

rotary support means for supporting and spinning said substrate in horizontal posture;

solvent spray means for spraying a solvent to said substrate, said solvent spray means including a container for storing said solvent, a solvent spray nozzle communicating with said container and having a spray gun attached to a forward end thereof for spraying said solvent as mixed with a pressurized gas, and a drive unit for swinging said solvent spray nozzle between a standby position and a supply position, said drive unit being operable to swing said solvent spray nozzle supplied with a pressurized gas;

coating solution supply means for supplying said coating solution to said substrate;

storage means for storing a processing program including a first time for maintaining said substrate still or spinning said substrate at a first rotational frequency, a second time for spraying said solvent to said substrate, a third time for maintaining said substrate still or spinning said substrate at a second rotational frequency, a fourth time for supplying said coating solution to said substrate, a fifth time before said coating solution supplied to said substrate spreads and entirely covers said surface of said substrate, a sixth time for decelerating said substrate to a third rotational frequency lower than said second rotational frequency, a seventh time for accelerating said substrate to a fourth rotational frequency, an eighth time for maintaining said substrate at a fifth rotational frequency for a predetermined period, and a ninth time lasting from a start of deceleration from said second rotational frequency to said third rotational frequency to attainment of said third rotational frequency;

timer means acting as a reference for each time stored in said storage means; and control means operable to perform controls with reference to said timer means for causing said rotary support means to handle said substrate for said first time, causing said solvent spray means to spray said solvent for said second time, causing said rotary support means to handle said substrate for said third time, causing said coating solution supply means to supply said coating solution for said fourth time, causing said rotary support means to decelerate said substrate to said third rotational frequency at said fifth time and said sixth time, causing said rotary support means to accelerate said substrate to said fourth rotational frequency at said fifth time and said seventh time, causing said rotary support means to maintain said fifth rotational frequency for said eighth time, and causing said coating solution supply means to continue supplying said coating solution at least from the start of deceleration at said sixth time from said second rotational frequency to said third rotational frequency to attainment of said third rotational frequency.

4. An apparatus for applying a coating solution to a surface of a substrate to form a coating film of desired thickness thereon, comprising:

rotary support means for supporting and spinning said substrate in horizontal posture;

solvent spray means for spraying a solvent to said substrate, said solvent spray means including a container for storing said solvent, a heater for heating said container to generate a vapor of said solvent, a solvent spray nozzle communicating with said container and having a spray gun attached to a forward end thereof, and a drive unit for swinging said solvent spray nozzle between a standby position and a supply position, said drive unit being operable to swing said solvent spray nozzle supplied with a pressurized gas;

coating solution supply means for supplying said coating solution to said substrate;

storage means for storing a processing program including a first time for maintaining said substrate still or spinning said substrate at a first rotational frequency, a second time for spraying said solvent to said substrate, a third time for maintaining said substrate still or spinning said substrate at a second rotational frequency, a fourth time for supplying said coating solution to said substrate, a fifth time before said coating solution supplied to said substrate spreads and entirely covers said surface of said substrate, a sixth time for decelerating said substrate to a third rotational frequency lower than said second rotational frequency, a seventh time for accelerating said substrate to a fourth rotational frequency, an eighth time for maintaining said substrate at a fifth rotational frequency for a predetermined period, and a ninth time lasting from a start of deceleration from said second rotational frequency to said third rotational frequency to attainment of said third rotational frequency;

timer means acting as a reference for each time stored in said storage means; and control means operable to perform controls with reference to said timer means for causing said rotary support means to handle said substrate for said first time, causing said solvent spray means to spray said solvent for said second time, causing said rotary support means to handle said substrate for said third time, causing said coating solution supply means to supply said coating solution for said fourth time, causing said rotary support means to decelerate said substrate to said third rotational frequency at said fifth time and said sixth time, causing said rotary support means to accelerate said substrate to said fourth rotational frequency at said fifth time and said seventh time, causing said rotary support means to maintain said fifth rotational frequency for said eighth time, and causing said coating solution supply means to continue supplying said coating solution at least from the start of deceleration at said sixth time from said second rotational frequency to said third rotational frequency to attainment of said third rotational frequency.

* * * * *